United States Patent
Weber

(10) Patent No.: US 7,163,900 B2
(45) Date of Patent: Jan. 16, 2007

(54) USING POLYDENTATE LIGANDS FOR SEALING PORES IN LOW-K DIELECTRICS

(75) Inventor: Frank Weber, Austin, TX (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/978,540

(22) Filed: Nov. 1, 2004

(65) Prior Publication Data

US 2006/0094256 A1 May 4, 2006

(51) Int. Cl.
H01L 21/469 (2006.01)
(52) U.S. Cl. .................................. 438/780
(58) Field of Classification Search ............ 430/106.2, 430/108; 438/778–780, 788, 790, 793, 794
See application file for complete search history.

(56) References Cited

U.S. PATENT DOCUMENTS

| | | | |
|---|---|---|---|
| 5,143,753 A * | 9/1992 | Novotny et al. ............ | 204/601 |
| 6,350,675 B1 | 2/2002 | Chooi et al. | |
| 6,351,039 B1 | 2/2002 | Jin et al. | |
| 6,410,149 B1 | 6/2002 | Hendricks et al. | |
| 6,417,118 B1 | 7/2002 | Hu et al. | |
| 6,521,542 B1 | 2/2003 | Armacost et al. | |
| 6,583,067 B1 | 6/2003 | Chang et al. | |
| 6,605,549 B1 * | 8/2003 | Leu et al. ................... | 438/758 |
| 6,759,325 B1 | 7/2004 | Raaijmakers et al. | |
| 2002/0034647 A1 | 3/2002 | Chen et al. | |
| 2003/0085473 A1 | 5/2003 | Usami | |
| 2003/0198895 A1 * | 10/2003 | Toma et al. ................ | 430/314 |
| 2004/0072436 A1 | 4/2004 | RamachandraRao et al. | |
| 2004/0150012 A1 | 8/2004 | Jin et al. | |
| 2004/0152296 A1 | 8/2004 | Matz et al. | |

FOREIGN PATENT DOCUMENTS

WO  WO 2004/068555 A2   8/2004

OTHER PUBLICATIONS

Sunseri, J.D., et al., "Reducing Residual Silanol Interactions in Reversed-Phase Liquid Chromotography Thermal Treatment of Silica Before Derivization," Journal of Chromotography A, 1011 (2003) pp. 23-29.

Sunseri, J.D., et al., "Complete Methylation of Silica Surfaces: Next Generation of Reversed-Phased Liquid Chromotography Stationary Phases," Langmuir, 19 (2003) pp. 8608-8610.

Satu, E., "Atomic Layer Deposition of a High-Density Aminopropylsiloxane Network on Silica through Sequential Reactions of Gamma-Aminopropyltrialkoxysilanes and Water," Langmuir, vol. 2003, No. 19, American Chemical Society, Nov. 6, 2003, pp. 10601-10609.

* cited by examiner

*Primary Examiner*—Calvin Lee
(74) *Attorney, Agent, or Firm*—Slater & Matsil, L.L.P.

(57) ABSTRACT

In preferred embodiments, a polydentate pore-sealing ligand is used to seal or repair pores damaged by plasma processing. The polydentate ligand includes bidentate ligands corresponding to the general formula $X—CH_2—(CH_2)_n—CH_2—X$ or $X—Si(CH_3)_2—(CH_2)_n—Si(CH_3)_2—X$. The polydentate ligand also includes tridentate ligands corresponding to the general formula $X—CH_2—(CH_2)_m(CXH)(CH_2)_o—CH_2—X$ or $X—Si(CH_3)_2—(CH_2)_m(CXH)(CH_2)_o—Si(CH_3)_2—X$. Alternative embodiments may include single or multiply branched polydentate ligands. Other embodiments include ligands that are cross-linked after attachment to the dielectric. Still other embodiments include a derivatization reaction wherein silanol groups formed by plasma damage are removed and favorable dielectric properties are restored.

46 Claims, 4 Drawing Sheets

USING POLYDENTATE LIGANDS FOR SEALING PORES IN LOW-K DIELECTRICS

CROSS-REFERENCE TO RELATED APPLICATIONS

This application is related to co-pending and commonly assigned U.S. application entitled Repair of Carbon Depletion in Low-k Dielectric Films, Ser. No. 10/927,899, filed Aug. 27, 2004, which application is incorporated herein by reference.

TECHNICAL FIELD

This invention relates generally to semiconductor device manufacturing and more particularly to the formation and processing of low-k dielectric films.

BACKGROUND

As the density of semiconductor devices increases and the size of circuit elements becomes smaller, the resistance capacitance (RC) delay time increasingly dominates the circuit performance. To reduce the RC delay, the demands on interconnect layers for connecting the semiconductor devices other increases. Therefore, there is a desire to switch from traditional silicon dioxide based dielectrics to low-k dielectrics. These materials are particularly useful as intermetal dielectrics, IMDs, and as interlayer dielectrics, ILDs.

One example of a low-k material is fluorine-doped silicon dioxide, or fluorosilicate glass (FSG). Another widely used material is a carbon-doped oxide or organosilicate glass (OSG). OSG films typically comprise $Si_wC_xO_yH_z$ wherein the tetravalent silicon may have a variety of organic group substitutions. A commonly used substitution creates methyl silsesquioxane (MSQ), wherein a methyl group creates a $SiCH_3$ bond in place of a SiO bond. There are several approaches known in the art for reducing the k-value of dielectric films. These include decreasing the film density, reducing the film ionization, and reducing the film polarization.

Since air has a dielectric constant of about 1, one method for making low-k dielectrics incorporates air into dense materials to make them porous. The dielectric constant of the resulting porous material is combination of the dielectric constant of air and the dielectric constant of the dense material. Therefore, it is possible to lower the dielectric constant of current low-k materials by making them porous.

Silica based xerogels and aerogels, for example, incorporate a large amount of air in pores or voids, thereby achieving dielectric constants less than 1.95 with pores are as small as 5–10 nm. A major drawback with low-k dielectrics, however, is that they are susceptible to damage from plasma etching and ashing processes used in device fabrication. In etch and ash processing, low-k materials frequently suffer from carbon depletion at the surface exposed to the plasmas. In certain etch and ash processes, the damage may also extend into the bulk as well. When there is an open pore structure in the dielectric, processing fluids in lap and polish and in thin film metallization can enter surface pores, thereby causing corrosion, mechanical damage, or an increase in the dielectric constant. Pore damage may also cause a surface that is preferably hydrophobic to become hydrophilic.

Recognizing the need to seal open pores near the surface of dielectrics, methods have been developed to deposit films on dielectric surfaces thereby sealing the open pores. However, some techniques are problematic in that highly surface-conforming layers may actually penetrate into the pore cavity. In such cases, even an insulating, pore-sealing layer defeats the advantage of the porous, low-k material by raising its dielectric constant.

Accordingly, a need exists for more effective methods of sealing pores in low-k dielectrics, particularly in the context of dual damascene metallization.

In addition to sealing pores, there is the need to repair damage to ILD's caused by plasma processing. Such plasma processes include etching, including etching of the low-k film, removing photoresist masking material, and depositing layers in plasma-enhanced chemical vapor deposition (PECVD) processes. In etch and ash processing, low-k materials frequently suffer from carbon depletion at the surface exposed to the plasmas. In certain etch and ash processes, the damage may also extend into the bulk as well. Upon subsequent exposure to air, or even in an oxygen containing ash, these damaged surfaces may react with moisture to form silanol groups ($\equiv$Si—OH) at free Si sites. The silanol group is known in the art to increase the dielectric constant of the low-k dielectric material. It is also known that the damaged low-k dielectric material is vulnerable to chemical attack during exposure to wet chemical cleanups, mainly those containing HF or related compounds like $NH_4F$, which results in significant critical dimension (CD) loss of low-k dielectric film insulating structures. Similar effects are believed to occur in other low-k dielectric materials with silicon-hydrocarbon bonds that are converted to silanol when exposed to oxidizing or reducing plasmas.

Therefore, semiconductor manufacturers need a method for repairing carbon depletion in low-k dielectrics. Also needed is a method to seal pores in porous low-k dielectrics.

SUMMARY OF THE INVENTION

These and other problems are generally solved or circumvented, and technical advantages are generally achieved, by preferred embodiments of the present invention that provide a method of repairing porous, low-k dielectric films suffering from pore damage and carbon depletion.

In preferred embodiments, a polydentate pore-sealing ligand is used to seal or close pores damaged by plasma processing. The ligand is preferably a bidentate chelating agent. In other preferred embodiments, the polydentate ligand is a branched ligand or a ligand that includes functional groups.

In other embodiments, the pore sealing method includes a two-step process. The first step includes reacting the ligand with the low-k insulator. Following the first step, an in situ, ligand cross-linking step occurs.

In alternative preferred embodiments, a carbon depletion repair process may precede and/or follow the pore-sealing ligand process. A carbon depletion repair comprising a two-step approach converts silanol or alcohol groups to a carbon-containing, organic group. The first step includes using a halogenating reagent, or agent, to convert the silanol group to a silicon halide. The second step includes using a derivatization reagent, also called a derivatizing reagent or derivatizing agent, to replace the halide with a suitable organic group.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that may be embodied in a wide variety of specific contexts.

In preferred embodiments, a polydentate, pore-sealing ligand is used to seal or close pores damaged by plasma or other manufacturing processes. Although ligands are well known in the chemical arts, the terminology may not be familiar to those in semiconductor manufacturing. Accordingly, a few terms are briefly reviewed.

Ligands that bond to only single functional group through one site are termed monodentate. Some ligand molecules are able to bind to multiple sites, due to having free lone pairs on more than one atom. These are called polydentate ligands. Bidentate ligands, which bond at two sites, are often referred to in the chemical arts as a chelating ligand, or as a chelating agent. Ethylene diamine tetraacetic acid (EDTA) is an example of a polydentate ligand that it is able to bond through 6 sites. With EDTA bonding, the ligand generally contributes all the electrons to form the bond. However, this is not always the case. In some situations, electron sharing may be distributed between the ligand and the substrate molecule. Such bonds tend to be very strong and stable. Polydentate ligands also tend to be very stable, as it is necessary to break larger number of bonding sites for them to be displaced. As used herein, the nomenclature used to describe a polydentate ligand is based on the number of points of attachment to the dielectric layer. For example, a tridendate ligand attaches at three points. Note that a tridentate ligand, may have a plurality of side groups or branches, which may or may not be chemically reactive, however, it has only three points of attachment to the dielectric.

The present invention will now be described with respect to preferred embodiments in a specific context, namely specific steps in the manufacture an integrated circuit comprising multiple level copper metallization formed by way of a conventional dual damascene process. Complete details of an exemplary dual damascene manufacturing process are provided in U.S. Pat. No. 6,521,542 to Armacost et al. and are incorporated herein by reference. It is believed that embodiments of this invention are advantageous when used in a damascene metallization process. It is further believed that embodiments described herein will benefit other manufacturing stages involving low-k films not specifically illustrated. Therefore, the specific embodiments discussed are merely illustrative of specific ways to make and use the invention, and do not limit the scope of the invention.

Figure 1:
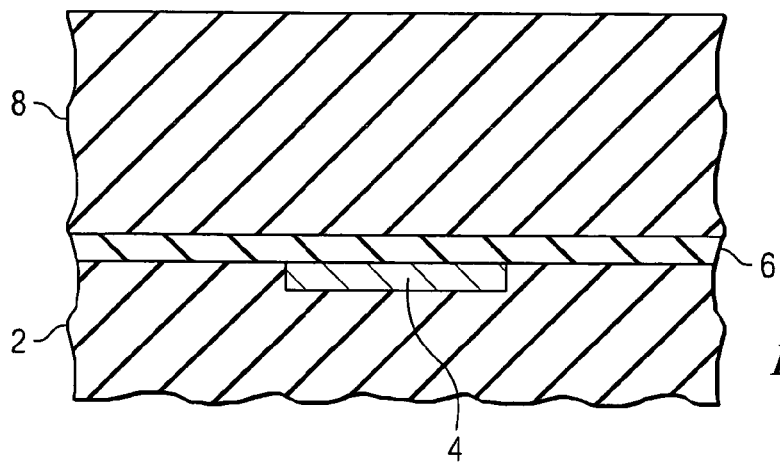
FIGS. 1 through 3 are cross-sectional views illustrating the manufacture of an exemplary damascene structure according to preferred embodiments of the invention.

Referring to FIG. 1, a conductor 4 is disposed within a trench formed in low-k insulator layer 2 in accordance with a dual damascene process. A silicon nitride ($Si_3N_4$) layer 6 is deposited over the insulator 2 and over the conductor 4 to act as an etch stop for subsequent processing and to protect the metal 4 from oxidation according to methods well-known to those skilled in the art. A low-k interlevel dielectric layer 8 is deposited over the nitride layer 6. Dielectric layer 8 overlies a semiconductor substrate (not shown) that may contain, by way of example, resistors or active devices such as transistors and diodes beneath dielectric layer 8. In accordance with preferred embodiments, the low-k interlevel dielectric layer 8 is preferably organosilicate glass (OSG). The OGS 8 is deposited in a conventional manner for such material such as CVD. Depending on the application, this layer 8 may be less than about 1 μm thick.

One skilled in the art recognizes that a cap dielectric layer (not shown) may be disposed upon the low-k insulator layer 8. The cap dielectric layer protects low-k insulator layer 8 from the etches used to form vias and trenches and from CMP after metal deposition. A cap dielectric layer may comprise silicon carbide, or titanium aluminum nitride, titanium nitride, aluminum nitride, tantalum aluminide, tantalum aluminum nitride, and similar materials. Using conventional methods, the cap dielectric layer is generally formed by a plasma-based process, such as plasma enhanced chemical vapor deposition (PECVD).

Because this cap layer deposition involves plasma, the exposed top surface of low-k insulating layer 8 is exposed to the plasma, and the MSQ species at that top surface or, depending upon the process, in the bulk are damaged. This plasma damage is the same as that described above, in that Si—$CH_3$ bonds are broken and silanol (Si—OH) is formed. Plasma damage may also include formation of silicon-hydrogen (Si—H) bonds or silicon dangling bonds. The silicon-hydrogen and silicon dangling bonds are usually converted to silanol upon subsequent exposure to moisture or air.

Following the plasma PECVD, a carbon depletion repair may be performed. However, according to this embodiment, trenches and vias are also to be etched using plasma into insulator layer 8. Therefore, a carbon depletion repair at this point is optional.

Figure 2:
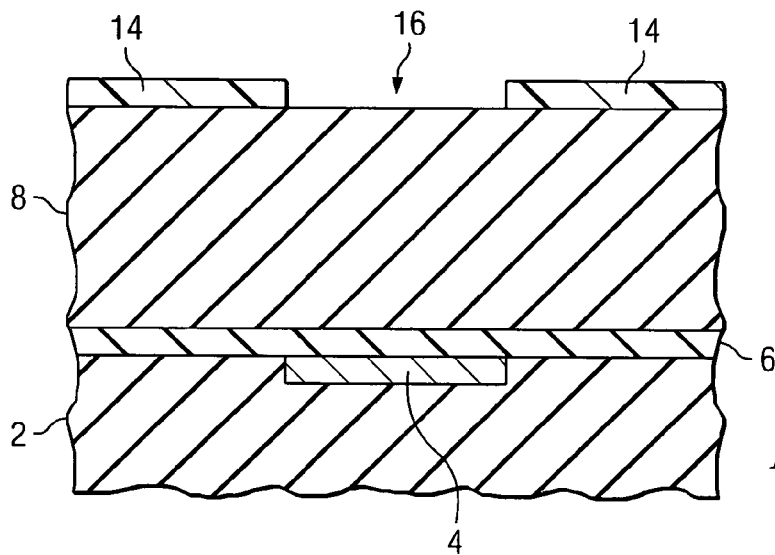

Referring to FIG. 2, the fabrication of the integrated circuit structure continues, with the deposition and application of a photoresist 14. The photoresist layer 14 may be spun on to dielectric layer 8. The photoresist layer 14 is, for example, a standard deep UV resist system, with an ARC such as AR3 (manufactured by Shipley, Marlborough, Mass.), or DUV 30 (manufactured by Brewer Science, Rolla, Mo.) and a photoresist such as JSR resist (manufactured by JSR Microelectronics, Sunnyvale, Calif.). Photoresist 14 is then exposed and developed to define the via locations 16 to be etched through low-k insulator layer 8.

Figure 3:
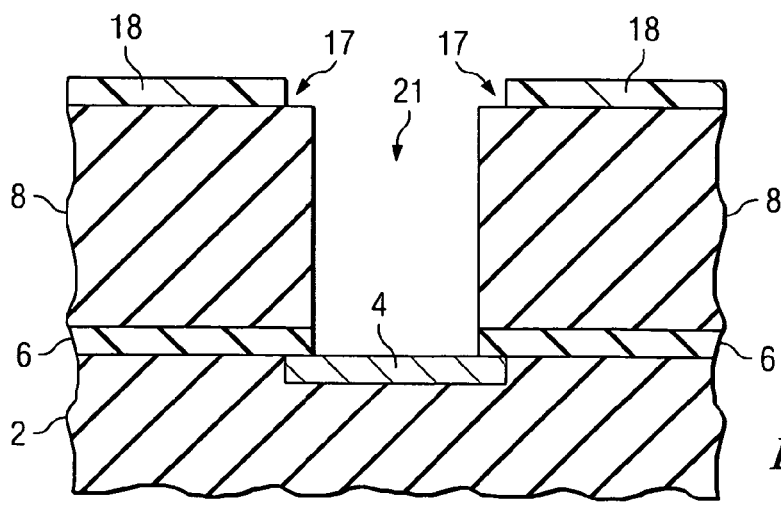

Following the patterning of photoresist 14, the low-k insulator layer 8 is etched to form vias 21 by conventional methods, FIG. 3. As shown in FIG. 3, the photolithographic patterning of trenches to be formed into low-k dielectric layer 8 is performed next. A photoresist layer 18 is dispensed upon the low-k dielectric layer 8. After photolithographic exposure and development, the remaining portions of photoresist layer 18 define the trench locations 17 to be etched into insulating layer 8. As is well known in the dual damascene process, trenches are formed both at via locations, as shown in FIG. 3, and also elsewhere at the surface low-k insulating layer 8 at which copper conductors are to run along the surface of integrated circuit, between or away from via locations.

Figure 4A:
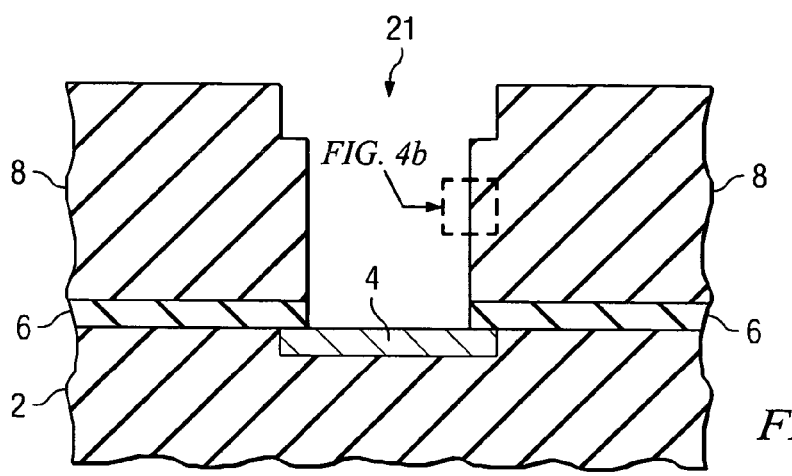
FIGS. 4A and 4B are cross sectional views illustrating a plasma-damaged low-k dielectric.

Plasma etch of the low-k insulating layer 8 is then carried out. Because of the dissimilarities in materials between cap dielectric layer (not shown) and insulating layer 8, it is preferred that a two-step etch be performed, with the first etch selectively etching cap dielectric layer. The second etch step, which forms the trenches into insulating layer 8, is preferably a timed plasma etch, to form the wider trenches into insulating layer 8 to a desired trench depth, as shown in FIG. 4.

For purposes of illustration, chemical reactions are referred to herein as a first step or a second step, or referred to with more specificity such as a halogenation step. One skilled in the art recognizes that such references may actually comprise a plurality of steps or sub-steps. For example, steps or sub-steps may include distillation, extraction, phase separation, purification, temperature changes, or other examples well known in the chemical arts. Furthermore, a step may include using several reaction vessels or containers, mediums, devices, or tools. Such conventional methodologies may be eliminated from the description for purposes of highlighting novel embodiments.

In alternative embodiments, etching of the cap layer 6 is controlled so that an optional remainder (not shown) is left covering the conductor 4. This remaining cap layer serves to protect the conductor 4 during the subsequent repair steps detailed below.

Photoresist layer 18 may be removed by dry stripping the photoresist in a stripper such as an ASPEN ICP (Inductively Coupled Plasma) or Performance Enhancement Platform (PEP) system (manufactured by Mattson Technology Inc., Fremont, Calif. and Gasonics, San Jose, Calif., respectively).

Figure 4B:
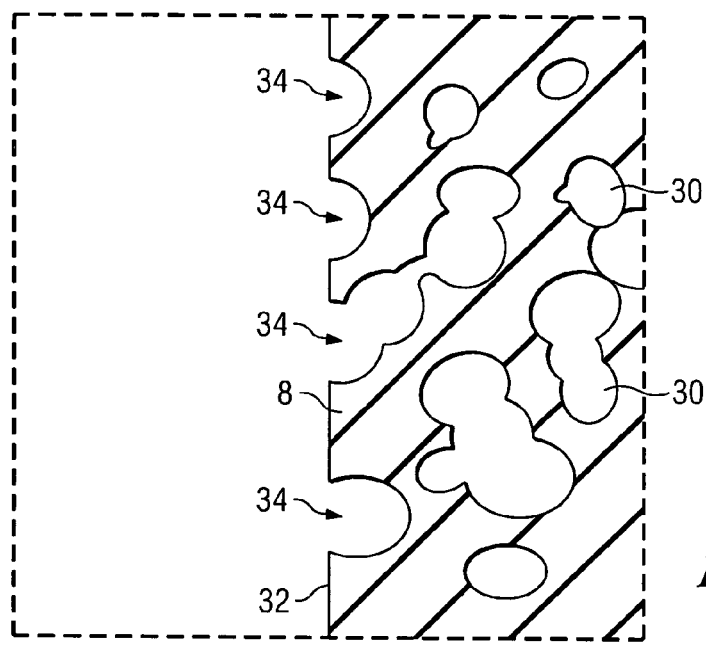

With reference to FIG. 4B, an enlarged view of the via sidewall is shown in cross-section. In accordance with the illustrated embodiment, the low k material 8 comprises a plurality of pores 30 within a matrix 8 of insulating material. The illustrated low-k material 8, comprises Nanoglass™, which is commercially available from Honeywell Advanced Microelectronic Materials of Sunnyvale, Calif. Nanoglass™ has a porosity of about 70% with an average pore size of about 4 nm, and it has a k value of about 2.0. For purposes of illustration in FIG. 4B, some pores are shown with about the average pore size, though the skilled artisan will readily appreciate that the pore size will deviate randomly from the average pore size and that the pore orientations relative to one another will also be random. As shown in FIG. 4B, none of the pores are completely filled. A subset 34 of the plurality of pores 30 are located at a surface 32 of the dielectric layer 8. Plasma processing as described above easily damages such surface pores 34. Accordingly, surface pores are preferably sealed or closed before further device fabrication.

Figure 5A:
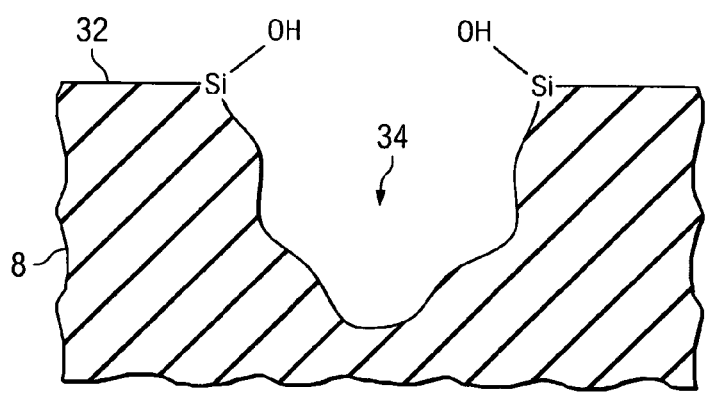
FIGS. 5A and 5B are cross sectional views illustrating a preferred embodiment of bidentate ligand pore sealing of a plasma-damaged low-k dielectric.

According to preferred embodiments, pore sealing, or repair, may be preformed to repair the plasma damage illustrated in FIG. 5A. This plasma damage is the same as that described above, in that surface Si bonds are broken and silanol (Si—OH) is formed. Plasma damage may also include formation of silicon-hydrogen (Si—H) bonds or silicon dangling bonds. As noted above, the silicon-hydrogen and silicon dangling bonds are usually converted to silanol upon subsequent exposure to moisture, which is illustrated in FIG. 5A.

Figure 5B:
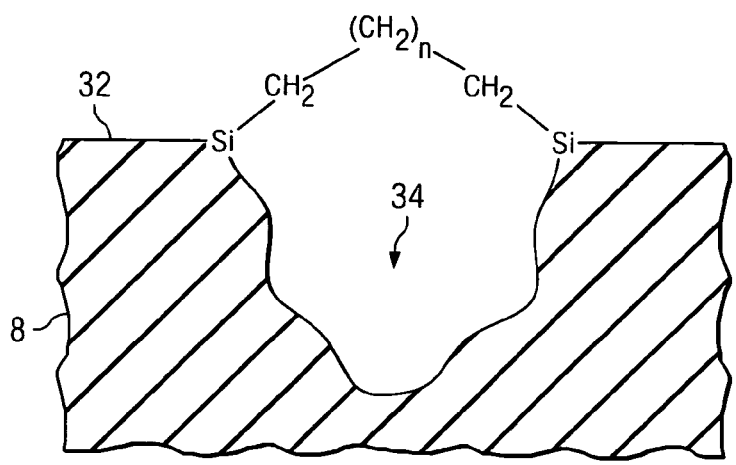

In preferred embodiments, FIG. 5B, open surfaces pores are preferably repaired using a pore-sealing ligand. In preferred embodiments, a polydentate pore-sealing ligand is used to seal or close pores damaged by plasma processing. The polydentate ligand is preferably a bidentate ligand, FIG. 5B.

Bidentate and polydendate pore-sealing ligands are advantageous because the ligands have multiple attachment points to the low-k dielectric layer. Many conventional dielectric treatments include molecules having only a single point of attachment. For these molecules, there is a greater chance of their removal during high temperature processing steps or other steps such as sputtering and cleanup. Therefore, embodiments of this invention include using polydentate, pore-sealing molecules having multiple points of attachment.

The pore-sealing ligand may be a reagent manufactured in a separate system and added to the plasma reaction chamber. Or, the pore sealing process may take place in a separate reaction chamber. In other embodiments, the pore-sealing ligand may be generated in situ where it is formed and shortly thereafter reacts with the damaged dielectric surface. The pore-sealing ligand repair process may occur in a single chemical reaction, or in a multi-step reaction.

As already described, plasma damage results in breaking silicon-carbon bonds and substituting them upon exposure to air or moisture to silanol groups, which undesirably raise the k value. Therefore preferred embodiments convert the silanol group to a functional group of lower k value such as Si—O—Si or Si—O—C, or more preferably, reform the original Si—C bond present before the damage.

Small molecules are better able to penetrate the pores and seal the pores inside the bulk due to their lower steric hindrance. In contrast, large molecules react at the entrance of surface pores, which seals the surface, but hinders internal pore repair. Accordingly, a preferred embodiment comprises a two-step process wherein internal pores are first treated with small repair molecules and subsequently thereafter; external pores are treated large molecules.

In preferred embodiments, the pore sealing ligand is represented by the general formula X—CH$_2$—(CH$_2$)$_n$—CH$_2$—X, wherein X is a leaving group and n=0–2. Leaving groups may include H, NH$_2$, Cl, Br, I, OCH$_3$, —SO$_2$F or triflate (—O—SO$_2$—CF$_3$). Upon formation of Si—O—Si or Si—O—C, HX is typically formed Alternative embodiments include larger ligands that are represented generally by the formula X—Si(CH$_3$)$_2$—(CH$_2$)$_n$—Si(CH$_3$)$_2$—X (n=0–2), wherein X is again the leaving group.

When one considers that the typical carbon-carbon bond length in an alkane is approximately 0.15 nm, one immediately realizes that X—CH$_2$—CH$_2$—X is too short a ligand to fully span an open dielectric pore, which may be several nanometers wide. In fact, to fully span a 3 nm pore with a straight-chain alkane requires 20+ carbon atoms, i.e. X—$(CH_2)_n$—X with n>20. However, fully spanning the open pore is not believed to be necessary, as pore sealing results are obtained through steric effects when the pore opening is only partially blocked, e.g. as with X—$CH_2$—$CH_2$—X. In applications wherein more pore blocking is required, embodiments disclosed herein that comprise branched or bulky side groups are appropriate. Some pore sealing results are also obtained when the ligands coat the inside of the pore.

In addition to pore size, chemical reactivity is another factor to consider when selecting large versus small molecules for pore-sealing applications. Small molecules suffer more from chemical or plasma attack due to lack of steric hindrance. On the other hand, large molecules suffer more from temperature due to thermal movement. These factors must be balanced in light of reliability and long-term stability of the finished semiconductor device, which normally has an expected lifetime of ten years.

Alternative embodiments may include single or multiply branched polydentate ligands. An example of single branched ligands includes compounds represented generally by X—$CH_2$—$(CH_2)_m(CR_1R_2)(CH_2)_o$—$CH_2$—X (2+m+o+1=n/2), wherein $R_1$ and $R_2$ are independently H, Alkyl, or Aryl. Branched ligands are preferably used if a high degree of steric hindrance in the pore-sealing reagent is required. Ligand branching may also alter chemical reaction kinetics. For example, a highly branched ligand may react via a $S_N1$ (substitution nucleophilic unimolecular) reaction mechanism instead of $S_N2$ (substitution nucleophilic bimolecular).

In yet another embodiment, the polydentate ligand may comprise a tridentate ligand. A preferred tridentate ligand is represented by the following general formula: X—$CH_2$—$(CH_2)_m$(CXH)$(CH_2)_o$—$CH_2$—X; or X—$Si(CH_3)_2$—$(CH_2)_m$(CXH)$(CH_2)_o$—$Si(CH_3)_2$—X; or X—$Si(CH_3)_2$—$(CH_2)_m$(SiXCH$_3$)$(CH_2)_o$—$Si(CH_3)_2$—X, where X is the leaving group. The chain length m≈o≈n can be approximated by pore size=(n+2)×1.22 Å. Alternative embodiments may further comprise single or multiple branching as described above.

Further examples of embodiments including polydentate ligands are represented by the following general formulas. Examples of polydentate ligands would be X—$CH_2$—$(CH_2)_m$(CH$(CH_2)_p$—X)$(CH_2)_o$—$CH_2$—X; or X—$Si(CH_3)_2$—$(CH_2)_m$(CH$(CH_2)_p$—X)$(CH_2)_o$—$Si(CH_3)_2$—X; or X—$Si(CH_3)_2$—$(CH_2)_m$(CH$(CH_2)_p$ SiX$(CH_3)_2$)$(CH_2)_o$—$Si(CH_3)_2$—X where X is the leaving group might be used. The chain length m≈o≈p≈n/2 can be approximated by pore size=(n+2)×1.22 Å. Single or multiple nonfunctional branching similar to described before is also within the scope of these embodiments.

In the branched, polydentate embodiments described above, the branch groups are relatively non-reactive in comparison to the dielectric-attaching chelating groups. For example, a straight chain hydrocarbon or an aryl group is generally less likely to react in comparison to a suitably chosen leaving group, X. The primary function of non-reactive groups is steric blocking of the pore. Preferred embodiments of this class are ligands having two points of attachment to the dielectric, plus one or more non-reactive branches. However, in alternative embodiments described below, a polydentate ligand may include functional, or chemically reactive, branch groups in addition to the chelating groups, which attach to the dielectric. Examples of chemically reactive groups include alcohols, halides, or amines.

Figure 6A:
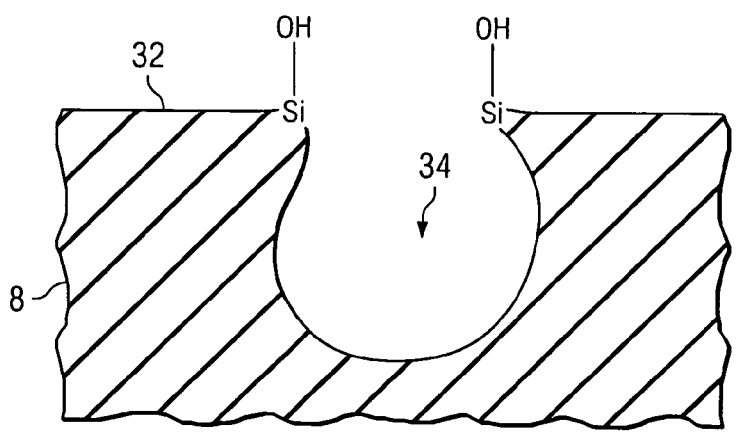
FIGS. 6A through 6C are cross sectional views illustrating a low-k dielectric repair according to embodiments that include steric effects, hydrophobic effects, and in situ cross-linking.
Figure 6B:
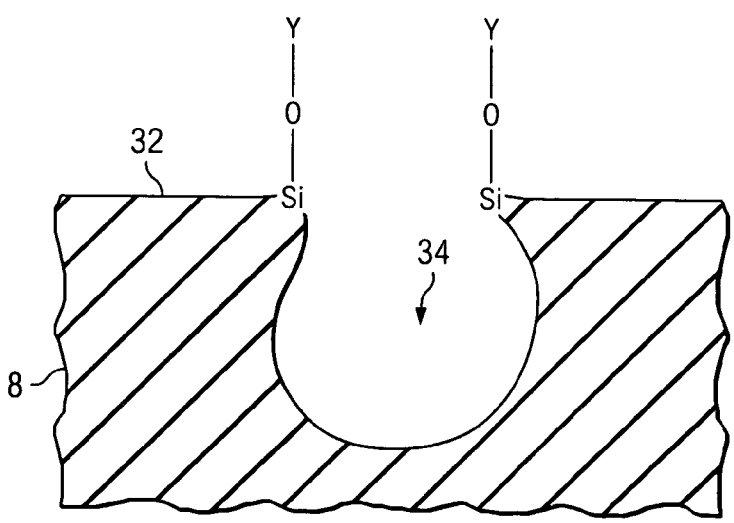
Figure 6C:
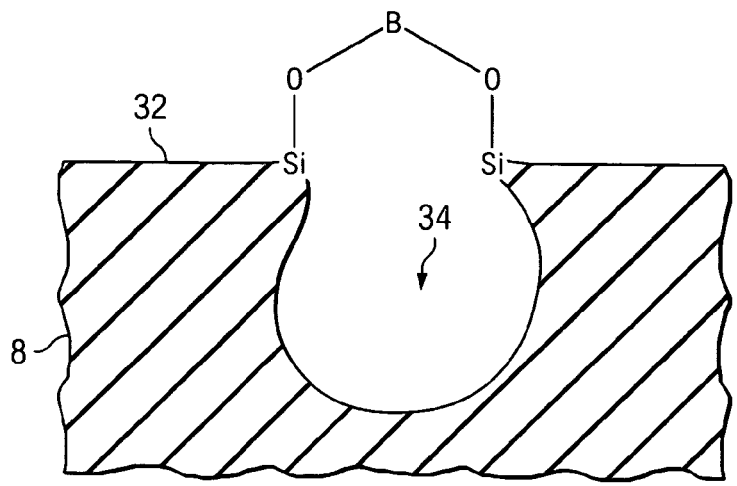

In another preferred embodiment, a chemically reactive polydentate ligand reacts in a two-step, pore sealing process. This process is schematically represented in FIGS. 6A–6C. FIG. 6A shows a damaged pore that has a silanol near the pore opening, although this process applies equally well when the group in an alcohol. In the first step, the ligand is attached to the dielectric, as shown in FIG. 6B. In the second step, FIG. 6C, the ligands undergo an in situ chemical reaction, preferably cross-linking. Preferred embodiments include reacting molecules X—$CH_2$—$(CH_2)_n$—Y or X—$Si(CH_3)_2$—$(CH_2)_n$—Y wherein X is the leaving and Y is another functional group. In preferred embodiments, Y may include O—H (alcohol), —$NH_2$ (amine), amide, imide or similar groups that may be connected in situ, for example by autocondensation. The cross-linking product, B, is shown in FIG. 6C. In embodiments wherein Y is OH, the cross-linking product is an ether, for example. Parameter n can be approximated by pore size=2×(n+2)×1.22 Å.

In other preferred embodiments, the ligands attached to the substrate, are linked by a molecule, thereby forming the structure shown in FIG. 6C. In another example, the linking molecule formaldehyde forms an acetale.

In other embodiments, the pore-sealing process may be optionally terminated with the reaction product illustrated in FIG. 6B. In this embodiment, the pore is blocked by steric hindrance or hydrophobic interactions generated by Y. Examples of hydrophobic groups includes aliphatic or perfluorated groups.

Figure 7A:
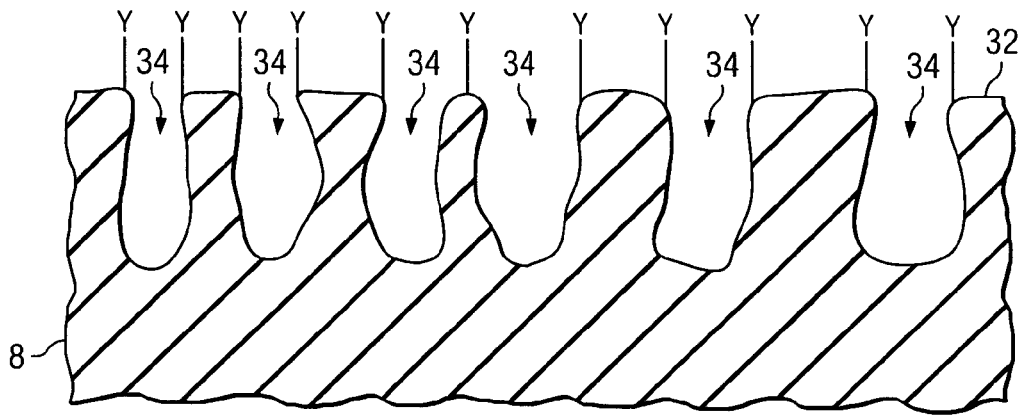
FIGS. 7A and 7B are cross sectional views illustrating a low-k dielectric repair according to alternative embodiments that include steric effects, hydrophobic effects, and in situ cross-linking.
Figure 7B:
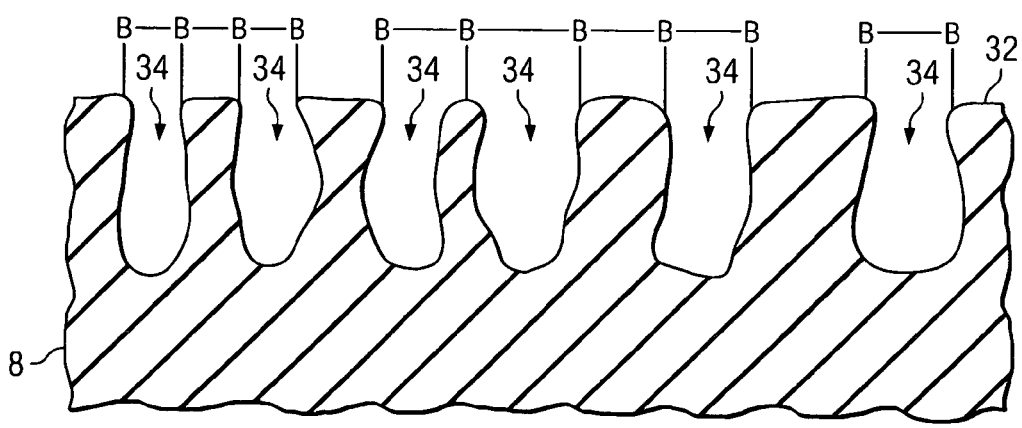

In other embodiments, shown in FIGS. 7A and 7B, may include additional functionality to permit multiple cross-linking. Such an embodiment, as shown in FIGS. 7A and 7B, includes X—$CH_2$—$(CH_2)_m(CR_1R_2Y_2)(CH_2)_o$—$CH_2$—$Y_1$ (2+m+o+1=n/2) where $Y_1$, and $Y_2$ may independently include O—H, —$NH_2$, amide, imide or similar groups that may be connected or condensed directly or after modification. Another embodiment of an in situ cross-linking process includes reacting molecules X—$CH_2$—$(CH_2)_n$—Y or X—$Si(CH_3)_2$—$(CH_2)_n$—Y where X is the leaving group. Chain length n can be varied in wide ranges. However, small n values (n=1–3) are preferred in situations where full saturation of the surface is desired. When n>>4, steric hindrance between adjacent molecules becomes significant, thereby making full surface coverage difficult.

In other embodiments, the single or multiple nonfunctional branching may occur. An example of single nonfunctional (non-reactive or inert) branching would be X—$CH_2$—$(CH_2)_m(CR_1R_2)(CH_2)_o$—$CH_2$—Y (2+m+o+1=n/2) where R is H, Alkyl or Aryl. A nonfunctional branching at the atom bond to the X or Y group is less favorable due to steric effects, but could enable another reaction scheme ($S_N1$ instead of $S_N2$).

After dielectric repair and pore sealing according to embodiments described herein, hydrophobic aliphatic groups typically dominate the surface. This is advantageous because even traces of adsorbed water increase the dielectric's k-value. On the other hand, this can cause problems at processes such as liner/barrier sputtering because layers may not adhere well to the highly hydrophobic dielectric. Alternative embodiments overcome this problem by adding a third functional group Z to the ligands attached to the bulk or the molecule B if applicable before the binding to bulk. Z might be —O—H, —$NH_2$, amide, imide, or similar groups that may be connected or condensed directly or after modification.

Alternative embodiments further include using protecting groups. Protecting groups are well known in the chemical arts, especially in multistep organic synthesis. Often a reagent reacts not only with the target functional group, but also with another functional group present in the system. Protective groups reversibly react with the problem functional group, thereby making it inert to the reagent but still allowing it to be regenerated after the desired chemical reaction is completed. A common example protective group use involves converting an —OH group to an ether before a Grignard synthesis, thereby preventing the OH from reacting with the highly basic organometallic. Other examples include acetates or hemiacetales as protected aldehyde or ketones.

In still another embodiment, multiple pore sealing ligands, each having unique pore sealing properties, may be used in a sequence of chemical steps. For example, a damaged dielectric may first be treated with small pore-reparing molecules. Next, a short plasma process follows. This generates surface silanol groups, which enhance chemical reactivity of the large pore-sealing molecules. Thereafter, a second pore-sealing step, which uses bulky, surface-sealing molecules, follows. Finally, in an alternative embodiment, a third treatment with small pore-repairing molecules may follow. This third step advantageously removes unreacted surface silanol groups.

According to other embodiments, a carbon depletion repair, or derivatization reaction, may be performed. Carbon depletion repair may occur before or after the pore-sealing ligand process, but preferably before. This sequence advantageously avoids excessive entrapment of reagents inside the pores 34, see e.g. FIG. 4B. In other embodiments, carbon depletion repair may be preformed even when there is no pore-sealing ligand step.

The details of carbon depletion repair are fully disclosed in co-pending and commonly assigned U.S. application entitled Repair of Carbon Depletion in Low-k Dielectric Films, Ser. No. 10/927,899, filed Aug. 27, 2004, so only the major points are summarized here. In preferred embodiments, a two-step approach converts silanol groups to a carbon-containing, organic group. The first step includes using a halogenating reagent, or agent, to convert the silanol group to a silicon halide. The second step includes using a derivatization reagent to replace the halide with a suitable organic group. In a preferred embodiment, the halogenating agent includes thionyl chloride and the derivatization agent includes an organometallic compound, preferably methyllithium. In another embodiment, the halogenating agent is selected from the group consisting essentially of $SO_2Cl_2$ (sulfuryl chloride) or $COCl_2$ (carboxydichloride). In another embodiment, the organometallic compound comprises a Grignard reagent. In yet another embodiment, the organometallic compound comprises an organic lithium compound, RLi, wherein R is selected from a group consisting essentially of alkyl or aryl compounds. In other embodiment, the organometallic compound is trimethyl aluminum, or more generally $R_A R_B R_C Al$, wherein $R_{A-C}$ may independently include an alkyl or aryl group. Other embodiments may include non-organometallic derivatizing compounds generally represented by $R_A R_B R_C C(R_D X)$ or $R_A R_B R_C Si(R_D X)$ or, wherein $R_{A-C}$ may independently include an alkyl group or hydrogen, $R_D$ may independently include an alkyl group, and X includes Br, I, R, O—R (R=alkyl), fluorosulfonate (—O—$SO_2$—F), or triflate (—O—$SO_2$—$CF_3$). Other embodiments may include non-organometallic derivatizing compounds generally represented by $R_A R_B C=CHR_C$, wherein $R_{A-C}$ may independently include an alkyl group or hydrogen. In yet other embodiments, derivatization reactions may fabricate rather than repair low-k, dielectric films. For example, porous silica, not normally considered a low-k dielectric, may be treated with a derivatizing reagent, thereby lowing its k value to a suitable level.

Following the low-k ILD pore sealing and/or repair, fabrication of the conductor is then carried out in accordance with conventional methods (not shown). According to this embodiment of the invention, a liner layer is deposited into the vias and trenches. The liner layer typically consists of a refractory metal, refractory metal nitride, or both. A metal, preferably copper, is then deposited into the vias and trenches. CMP then planarizes the structure, rendering the metal and liner layer flush with the surface of insulator layer. The remainder of the device fabrication, including the repeated forming of low-k insulator layers, via and trench etch, and metal deposition for additional metal levels, may then be carried out.

Although the present invention and its advantages have been described in detail, it should be understood that various changes, substitutions and alterations may be made herein without departing from the spirit and scope of the invention as defined by the appended claims. For example, it will be readily understood by those skilled in the art that materials and methods may be varied while remaining within the scope of the present invention.

It is also appreciated that the present invention provides many applicable inventive concepts other than the specific contexts used to illustrate preferred embodiments. For example, although the illustrations included repair of a low-k dielectric film, the invention is not limited to only dielectric pore sealing or repair. For example, porous silica is not normally considered to be a low-k dielectric material. However, porous silica may be treated as damaged according to embodiments of this invention. Therefore, embodiments described herein comprise methods suitable for low-k dielectric manufacture, not just pore sealing or repair. A method may comprise depositing a suitable layer or film, preferably porous silica, and then performing a treatment as described herein. Embodiments herein are also useful in manufacturing materials having carbon-rich, hydrophobic surfaces such as semiconductors or certain optics.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for forming a carbon-containing, porous low-k dielectric layer on a semiconductor substrate, the method comprising:
   providing a carbon containing, porous, low-k dielectric layer on said semiconductor substrate; and
   treating the pores of said low-k, porous dielectric layer with a polydentate pore-sealing ligand.

2. The method of claim 1, wherein the polydentate pore-sealing ligand is a bidentate ligand.

3. The method of claim 2, wherein the bidentate ligand corresponds to the general formula X—CH$_2$—(CH$_2$)$_n$—CH$_2$—X; wherein n=0–2; and wherein X is NH$_2$, Cl, Br, I, OCH$_3$, —SO$_2$F or triflate.

4. The method of claim 2, wherein the bidentate ligand corresponds to the general formula X—Si(CH$_3$)$_2$—(CH$_2$)$_n$—Si(CH$_3$)$_2$—X; wherein n=0–2; and wherein X is H, NH$_2$, Cl, Br, I, —OCH$_3$, —SO$_2$F or triflate.

5. The method of claim 2, wherein the bidentate ligand is a branched ligand.

6. The method of claim 5, wherein the branched ligand corresponds to the general formula X—CH$_2$—(CH$_2$)$_m$(CR$_1$R$_2$)(CH$_2$)$_o$—CH$_2$—X; wherein 2+m+o+1=n/2; wherein R$_1$ and R$_2$ are independently H, Alkyl, or Aryl; and wherein X is NH$_2$, Cl, Br, I, OCH$_3$, —SO$_2$F or triflate.

7. The method of claim 1, wherein the polydentate pore-sealing ligand is a tridentate ligand.

8. The method of claim 7, wherein the tridentate ligand corresponds to the general formula X—CH$_2$—(CH$_2$)$_m$(CXH)(CH$_2$)$_o$—CH$_2$—X; wherein m≈o≈n; and wherein X is NH$_2$, Cl, Br, I, OCH$_3$, —SO$_2$F or triflate.

9. The method of claim 7, wherein the tridentate ligand corresponds to the general formula X—Si(CH$_3$)$_2$—(CH$_2$)$_m$(CXH)(CH$_2$)$_o$—Si(CH$_3$)$_2$—X; wherein m≈o≈n; and wherein X is H, NH$_2$, Cl, Br, I, OCH$_3$, —SO$_2$F or triflate.

10. The method of claim 7, wherein the tridentate ligand corresponds to the general formula X—Si(CH$_3$)$_2$—(CH$_2$)$_m$(SiXCH$_3$)(CH$_2$)$_o$—Si(CH$_3$)$_2$—X; wherein m≈o≈n; and wherein X is H, NH$_2$, Cl, Br, I, OCH$_3$, —SO$_2$F or triflate.

11. The method of claim 1, wherein the polydentate pore-sealing ligand corresponds to the general formula X—CH$_2$—(CH$_2$)$_m$(CH(CH$_2$)$_p$—X)(CH$_2$)$_o$—CH$_2$—X; wherein m≈o≈p≈n/2; wherein X is H, NH$_2$, Cl, Br, I, OCH$_3$, —SO$_2$F or triflate.

12. The method of claim 1, wherein the polydentate pore-sealing ligand corresponds to the general formula X—Si(CH$_3$)$_2$—(CH$_2$)$_m$(CH(CH$_2$)$_p$—X)(CH$_2$)$_o$—Si(CH$_3$)$_2$—X; wherein m≈o≈p≈n/2; wherein X is H, NH$_2$, Cl, Br, I, OCH$_3$, —SO$_2$F or triflate.

13. The method of claim 1, wherein the polydentate pore-sealing ligand corresponds to the general formula X—Si(CH$_3$)$_2$—(CH$_2$)$_m$(CH(CH$_2$)$_p$SiX(CH$_3$)$_2$)(CH$_2$)$_o$—Si(CH$_3$)$_2$—X; wherein m≈o≈p≈n/2; wherein X is H, NH$_2$, Cl, Br, I, OCH$_3$, —SO$_2$F or triflate.

14. The method of claim 1, wherein the polydentate pore-sealing ligand corresponds to the general formula X—CH$_2$—(CH$_2$)$_n$—Y; wherein n=0–3; wherein X is H, NH$_2$, Cl, Br, OCH$_3$, —SO$_2$F or triflate; and wherein Y is O—H, —NH$_2$, amide, or imide.

15. The method of claim 1, wherein the polydentate pore-sealing ligand corresponds to the general formula X—Si(CH$_3$)$_2$—(CH$_2$)$_n$—Y; wherein n=0–3; wherein X is H, NH$_2$, Cl, Br, I, OCH$_3$, —SO$_2$F or triflate; and wherein Y is O—H, —NH$_2$, amide, or imide.

16. The method of claim 1, wherein reacting the plurality of open pores with a polydentate pore-sealing ligand comprises the steps of reacting the polydentate pore-sealing ligand with the carbon-containing, porous, low-k insulator and then cross-linking the polydentate pore-sealing ligand.

17. The method of claim 1, wherein the carbon-containing, porous, low-k dielectric layer comprises a carbon-doped oxide.

18. The method of claim 1, wherein the carbon-containing, porous, low-k dielectric layer comprises porous silica.

19. The method of claim 1, wherein the carbon-containing, porous, low-k dielectric layer comprises OSG.

20. The method of claim 1 further comprising:
forming a silicon halide by reacting a silanol in the carbon-containing, porous, low-k dielectric layer with a halogenating agent; and
performing a derivatizing reaction with the silicon halide.

21. The method of claim 20, wherein the halogenating agent is selected from the group consisting essentially of thionyl chloride, sulfuryl chloride and carboxydichloride.

22. The method of claim 20, wherein the derivatizing reaction includes using an organometallic compound.

23. The method of claim 22, wherein the organometallic compound is selected from the group consisting essentially of a Grignard reagent, lithium dialkylcopper, trimethyl aluminum, and methyl lithium.

24. A method of fabricating a semiconductor device comprising:
forming an active device on a substrate;
depositing a carbon-containing, porous, low-k insulator over the active device;
exposing the insulator to a plasma;
sealing a plurality of open pores in the carbon-containing, porous, low-k insulator by reacting the plurality of open pores with a polydentate pore-sealing ligand.

25. The method of claim 24, wherein the polydentate pore-sealing ligand is a bidentate ligand.

26. The method of claim 25, wherein the bidentate ligand corresponds to the general formula X—CH$_2$—(CH$_2$)$_n$—CH$_2$—X; wherein n=0–2; and wherein X is NH$_2$, Cl, Br, I, —OCH$_3$, —SO$_2$F or triflate.

27. The method of claim 25, wherein the bidentate ligand corresponds to the general formula X—Si(CH$_3$)$_2$—(CH$_2$)$_n$—Si(CH$_3$)$_2$—X; wherein n=0–2; and wherein X is H, NH$_2$, Cl, Br, I, OCH$_3$, —SO$_2$F or triflate.

28. The method of claim 25, wherein the bidentate ligand is a branched ligand.

29. The method of claim 28, wherein the branched ligand corresponds to the general formula X—CH$_2$—(CH$_2$)$_m$(CR$_1$R$_2$)(CH$_2$)$_o$—CH$_2$—X; wherein 2+m+o+1=n/2; wherein R$_1$ and R$_2$ are independently H, Alkyl, or Aryl; and wherein X is NH$_2$, Cl, Br, I, OCH$_3$, —SO$_2$F or triflate.

30. The method of claim 24, wherein the polydentate pore-sealing ligand is a tridentate ligand.

31. The method of claim 30, wherein the tridentate ligand corresponds to the general formula X—CH$_2$—(CH$_2$)$_m$(CXH)(CH$_2$)$_o$—CH$_2$—X; wherein m, o≈n; and wherein X is NH$_2$, Cl, Br, I, OCH$_3$, —SO$_2$F or triflate.

32. The method of claim 30, wherein the tridentate ligand corresponds to the general formula X—Si(CH$_3$)$_2$—(CH$_2$)$_m$(CXH)(CH$_2$)$_o$—Si(CH$_3$)$_2$—X; wherein m≈o≈n; and wherein X is H, NH$_2$, Cl, Br, I, OCH$_3$, —SO$_2$F or triflate.

33. The method of claim 30, wherein the tridentate ligand corresponds to the general formula X—Si(CH$_3$)$_2$—(CH$_2$)$_m$(SiXCH$_3$)(CH$_2$)$_o$—Si(CH$_3$)$_2$—X; wherein m≈o ≈n; and wherein X is H, NH$_2$, Cl, Br, I, OCH$_3$, —SO$_2$F or triflate.

34. The method of claim 24, wherein the polydentate pore-sealing ligand corresponds to the general formula X—CH$_2$—(CH$_2$)$_m$(CH(CH$_2$)$_p$—X)(CH$_2$)$_o$—CH$_2$—X; wherein m≈o≈p≈n/2; wherein X is NH$_2$, Cl, Br, I, OCH$_3$, —SO$_2$F or triflate.

35. The method of claim 24, wherein the polydentate pore-sealing ligand corresponds to the general formula X—Si(CH$_3$)$_2$—(CH$_2$)$_m$(CH(CH$_2$)$_p$—X)(CH$_2$)$_o$—Si(CH$_3$)$_2$—X; wherein m≈o≈p≈n/2; wherein X is H, NH$_2$, Cl, Br, I, OCH$_3$, —SO$_2$F or triflate.

36. The method of claim 24, wherein the polydentate pore-sealing ligand corresponds to the general formula X—Si(CH$_3$)$_2$—(CH$_2$)$_m$(CH(CH$_2$)$_p$SiX(CH$_3$)$_2$)(CH$_2$)$_o$—Si $(CH_3)_2$—X; wherein m≈o≈p≈n/2; wherein X is H, $NH_2$, Cl, Br, I, $OCH_3$, —$SO_2F$ or triflate.

37. The method of claim 24, wherein the polydentate pore-sealing ligand corresponds to the general formula X—$CH_2$—$(CH_2)_n$—Y; wherein n=0–3; wherein X is $NH_2$, Cl, Br, I, $OCH_3$, —$SO_2F$ or triflate; and wherein Y is —O—H, —$NH_2$, amide, or imide.

38. The method of claim 24, wherein the polydentate pore-sealing ligand corresponds to the general formula X—$Si(CH_3)_2$—$(CH_2)_n$—Y; wherein n=0–3; wherein X is H, $NH_2$, Cl, Br, I, $OCH_3$, —$SO_2F$ or triflate; and wherein Y is —O—H, —$NH_2$, amide, or imide.

39. The method of claim 24, wherein reacting the plurality of open pores with a polydentate pore-sealing ligand comprises the steps of reacting the polydentate pore-sealing ligand with the carbon-containing, porous, low-k insulator and then cross-linking the polydentate pore-sealing ligand.

40. The method of claim 24, wherein the carbon-containing, porous, low-k insulator comprises a carbon-doped oxide.

41. The method of claim 24, wherein the carbon-containing, porous, low-k insulator comprises porous silica.

42. The method of claim 24, wherein the carbon-containing, porous, low-k insulator comprises OSG.

43. The method of claim 24 further comprising:
forming a silicon halide by reacting a silanol in the carbon-containing, porous, low-k insulator with a halogenating agent; and
performing a derivatizing reaction with the silicon halide.

44. The method of claim 43, wherein the halogenating agent is selected from the group consisting essentially of thionyl chloride, sulfuryl chloride and carboxydichloride.

45. The method of claim 43, wherein the derivatizing reaction includes using an organometallic compound.

46. The method of claim 43, wherein the organometallic compound is selected from the group consisting essentially of a Grignard reagent, lithium dialkylcopper, trimethyl aluminum, and methyl lithium.

* * * * *